(12) United States Patent
Zucker

(10) Patent No.: US 6,370,796 B1
(45) Date of Patent: Apr. 16, 2002

(54) HEATER BLOCK COOLING SYSTEM FOR WAFER PROCESSING APPARATUS

(75) Inventor: Daniel Zucker, San Antonio, TX (US)

(73) Assignees: sony corporation, Tokyo (JP); Sony Electronics, Inc., Park Ridge, NJ (US)

( * ) Notice: Subject to any disclaimer, the term of this patent is extended or adjusted under 35 U.S.C. 154(b) by 0 days.

(21) Appl. No.: 09/675,157

(22) Filed: Sep. 29, 2000

(51) Int. Cl.[7] .............................. F26B 19/00; F28F 7/00
(52) U.S. Cl. .............................. 34/428; 34/391; 34/395; 34/61; 34/66; 118/724; 165/68; 165/80.3
(58) Field of Search .......................... 34/428, 391, 393, 34/395, 61, 66; 118/724; 165/68, 80.3, 87

(56) References Cited

U.S. PATENT DOCUMENTS

| | | | |
|---|---|---|---|
| 5,636,103 A | * | 6/1997 | Bushner |
| 5,997,649 A | * | 12/1999 | Hillman ................ 118/715 |
| 6,030,461 A | * | 2/2000 | Cantrell ................ 118/724 |
| 6,066,210 A | * | 5/2000 | Yonemitsu ............ 118/719 |
| 6,119,368 A | * | 9/2000 | Masterson ............ 34/404 |
| 6,193,811 B1 | * | 2/2001 | Sundarrajan et al. ..... 134/19 |
| 6,236,564 B1 | * | 5/2001 | Fan |
| 6,307,184 B1 | * | 10/2001 | Womack et al. |
| 6,311,766 B1 | * | 11/2001 | Lin et al. |

* cited by examiner

Primary Examiner—Denise L. Esquivel
Assistant Examiner—K. B. Rinehart
(74) Attorney, Agent, or Firm—Rader Fishman, & Grauer

(57) ABSTRACT

A cooling system and method are provided for cooling a heater block located in a cylindrical processing chamber of a wafer processing apparatus. The cooling system includes first and second frame assemblies having respective ends adapted to rest on an upper peripheral surface of the processing chamber, and fan assemblies mounted to the frame assemblies at spaced locations therealong. A first pair of fan assemblies are directed to push air into the processing chamber, and a second pair of fan assemblies are directed to pull air out of the processing chamber. The fan assemblies are arranged such that they circulate ambient air through the processing chamber to provide a rapid cooling of the heater block to a safe working temperature. The frame assemblies have an adjustable length that can be adjusted to fit processing chambers having different sizes and configurations. The cooling system substantially reduces the cooling time required for the heater block to reach a safe working temperature as compared to conventional cooling by free convection.

17 Claims, 5 Drawing Sheets

HEATER BLOCK COOLING SYSTEM FOR WAFER PROCESSING APPARATUS

BACKGROUND OF THE INVENTION

1. Field of the Invention

The present invention relates generally to semiconductor processing. In particular, the present invention relates to a system that provides rapid cooling of the heater block structure located within the processing chamber of a wafer processing apparatus.

2. Description of the Related Art

In the semiconductor industry, wafers are commonly processed using a gas process known as chemical vapor deposition ("CVD"). The CVD process forms thin layers of material over an integrated circuit substrate using thermal and/or plasma decomposition and reaction of selected gases. Conventional CVD materials include silicon dioxide, silicon nitride, and polysilicon, as well as a wide variety of well known CVD materials suitable for insulators and dielectrics, semiconductors, conductors, superconductors, and magnetics.

The processing chamber 10 of a conventional CVD processing apparatus is shown in FIGS. 1 and 2. The processing chamber 10 communicates with a load chamber 11 from which wafers to be processed are introduced into the processing chamber 10, and into which processed wafers are received from the processing chamber 10. Chamber gases are exhausted through vent ports. A system for moving waters from station to station in the processing chamber 10 includes a wafer transport mechanism 13.

FIG. 1 is a top view of the load chamber 11 and processing chamber 10 with the top plate 14 removed from the processing chamber 10. FIG. 2 is a side view of the processing chamber 10 with the top plate 14 in place and ready for high pressure CVD processing. A plurality of process stations 15 are provided at circumferentially spaced locations within the processing chamber 10. Each process station 15 includes, for example, a dispersion head 16 for introducing a process gas or gas mixture over a wafer to be processed, in coordination with activation of the wafer transport mechanism 13. A vacuum exhaust port 17, and a wafer transfer mechanism 18, are also provided, each of which is well known in the art.

In order to stimulate the deposition of material onto the wafer being processed, heat must be provided to the wafer. One method of providing heat to the wafer involves heating a heater block 20 having a large mass, which transfers heat to the wafers sitting respectively thereon. A resistive heating element or other suitable heating mechanism provides the necessary heat to the heater block 20. The heater block 20 typically has a temperature during wafer processing of approximately 300 to 400° C.

During both routine and unplanned maintenance and repair operations of the wafer processing apparatus, the heater block 20 must be cooled from its normal operating temperature down to a safe working temperature of approximately 50° C. The conventional method of heater block cooling during such maintenance operations is to turn off the heater breaker at the start of the gas line flush step. The cooling begins at that time under vacuum. After completion of several full gas line flushes, a 30 minute atmospheric chamber purge is performed to remove residual HF from the chamber. Approximately one hour elapses during these operations, during which time the heater block 20 cools from its initial 400° C. down to about 305° C. under vacuum. At that time, the chamber 10 is opened and allowed to cool to a safe working temperature by free convection. The total time for cooling from 400° C. to 50° C. is about 4 hours 20 minutes (260 minutes). Since routine maintenance operations typically occur monthly, and other unplanned maintenance and repairs are necessary at irregular intervals, the heater block cooling time described above results in a large amount of down time for the wafer processing apparatus.

A heater block cooling system has been developed recently by Novellus Systems, Inc. to minimize the down time required for cooling the heater block. This heater block cooling system includes a HEPA-filtered high flow vacuum system connected by a flexible duct to an aluminum shroud. The shroud is a two-piece design (two halves) connected by ¼ turn fasteners. A gasketed lip is provided near the lower edge of the shroud halves. The lip of each shroud half is placed on the chamber barrel, and the two halves of the shroud are jointed by six ¼ turn fasteners. The chamber top plate is then lowered onto the gasketed upper lip of the shroud to hold the shroud securely. The high-flow HEPA vacuum is then turned on. Cool fab air (70° F.) flows into the shroud through the five ports in the shroud. Baffles help to direct the air flow over the heater block surface, and the air exits through the nozzle/flex duct on the opposite side of the shroud. The heated air is then HEPA-filtered and exhausted back into the fab. This heater block cooling system decreases the time required for cooling the heater block. However, this cooling system is relatively complex, bulky and difficult to assemble to the chamber during maintenance operations.

Thus, there is a need for an improved heater block cooling system that can be used with processing chambers 10 of existing wafer processing machines to facilitate maintenance operations and reduce the down time required for cooling the heater block 20.

SUMMARY OF THE INVENTION

It is an object of the present invention to provide an apparatus for cooling the heater block in a processing chamber of a wafer processing machine that solves the problems with the prior art arrangements described above.

It is a further object of the present invention to provide a heater block cooling system and method that minimize the down time required for maintenance operations of a wafer processing machine by cooling the heater block rapidly using forced air circulation.

It is a still further object of the present invention to provide a heater block cooling system that is simple to manufacture, fast and easy to install, reliable and efficient in use, and readily adapted to fit processing chambers having different diameters and configurations.

According to the present invention, a heater block cooling system and method are provided for cooling a heater block located in a cylindrical processing chamber of a wafer processing apparatus. The cooling system includes first and second frame assemblies having respective ends adapted to rest on an upper peripheral surface of the processing chamber, and a plurality of fan assemblies mounted to the frame assemblies at spaced locations therealong. A first pair of fan assemblies are directed to push air into the processing chamber, and a second pair of fan assemblies are directed to pull air out of the processing chamber. The fan assemblies are arranged such that they circulate ambient air through the processing chamber to provide a rapid cooling of the heater block to a safe working temperature. The frame assemblies have an adjustable length that can be adjusted to fit processing chambers having different sizes and configurations. The cooling system according to the present invention substantially reduces the cooling time required for the heater block to reach a safe working temperature, as compared to conventional cooling by free convection.

According to a broad aspect of the present invention, a cooling system is provided for cooling a heater block in a processing chamber of a wafer processing apparatus, comprising: first and second frame assemblies having respective ends adapted to rest on an upper peripheral surface of a processing chamber; and a plurality of fan assemblies mounted to the frame assemblies at spaced locations therealong for circulating ambient air through the processing chamber.

According to another broad aspect of the present invention, a method is provided for cooling a heater block contained within a processing chamber of a wafer processing apparatus, comprising the steps of: providing a processing chamber having a generally cylindrical shape, a top plate that covers the processing chamber during wafer processing, and a heater block positioned within the processing chamber; removing the top plate to expose an open upper end of the processing chamber; placing a cooling system across the open upper end of the processing chamber, the cooling system having a plurality of fan assemblies mounted to a frame at spaced locations therealong; and operating the fan assemblies to circulate ambient air through the processing chamber for a sufficient time to cool the heater block to a safe working temperature.

Numerous other objects of the present invention will be apparent to those skilled in this art from the following description wherein there is shown and described a preferred embodiment of the present invention, simply by way of illustration of one of the modes best suited to carry out the invention. As will be realized, the invention is capable of other different embodiments, and its several details are capable of modification in various obvious aspects without departing from the invention. Accordingly, the drawings and description should be regarded as illustrative in nature and not restrictive.

BRIEF DESCRIPTION OF THE DRAWINGS

The present invention will become more clearly appreciated as the disclosure of the invention is made with reference to the accompanying drawings. In the drawings.

DETAILED DESCRIPTION OF THE PREFERRED EMBODIMENT

A heater block cooling system 30 according to a preferred embodiment of the present invention will be described below with reference to FIGS. 3 to 7 of the accompanying drawings.

Figure 1:
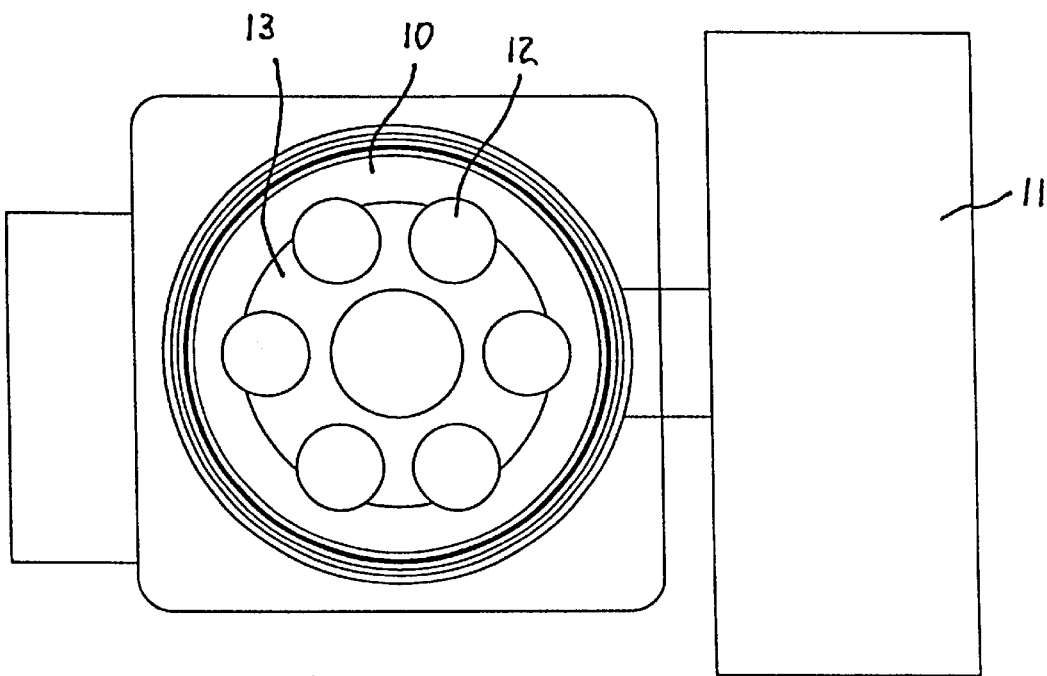
FIG. 1 is a plan view of a conventional processing chamber and load chamber for a chemical vapor deposition system.
Figure 2:
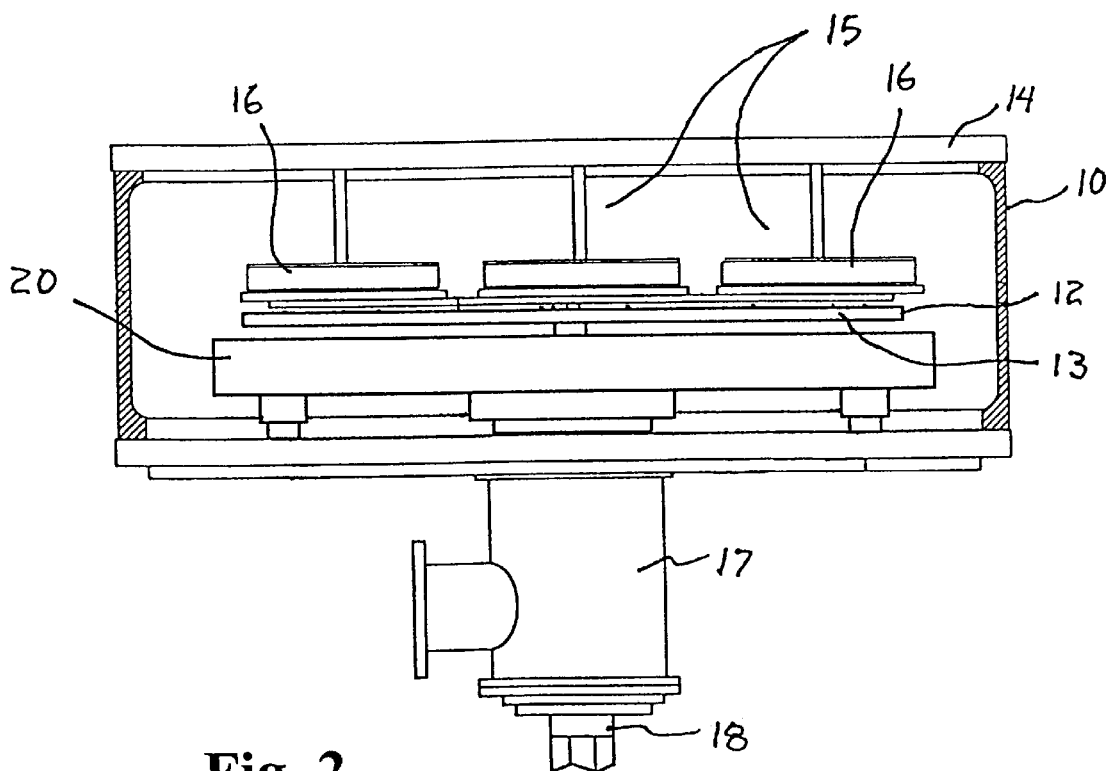
FIG. 2 is a cross-sectional view of the conventional processing chamber of FIG. 1
Figure 3:
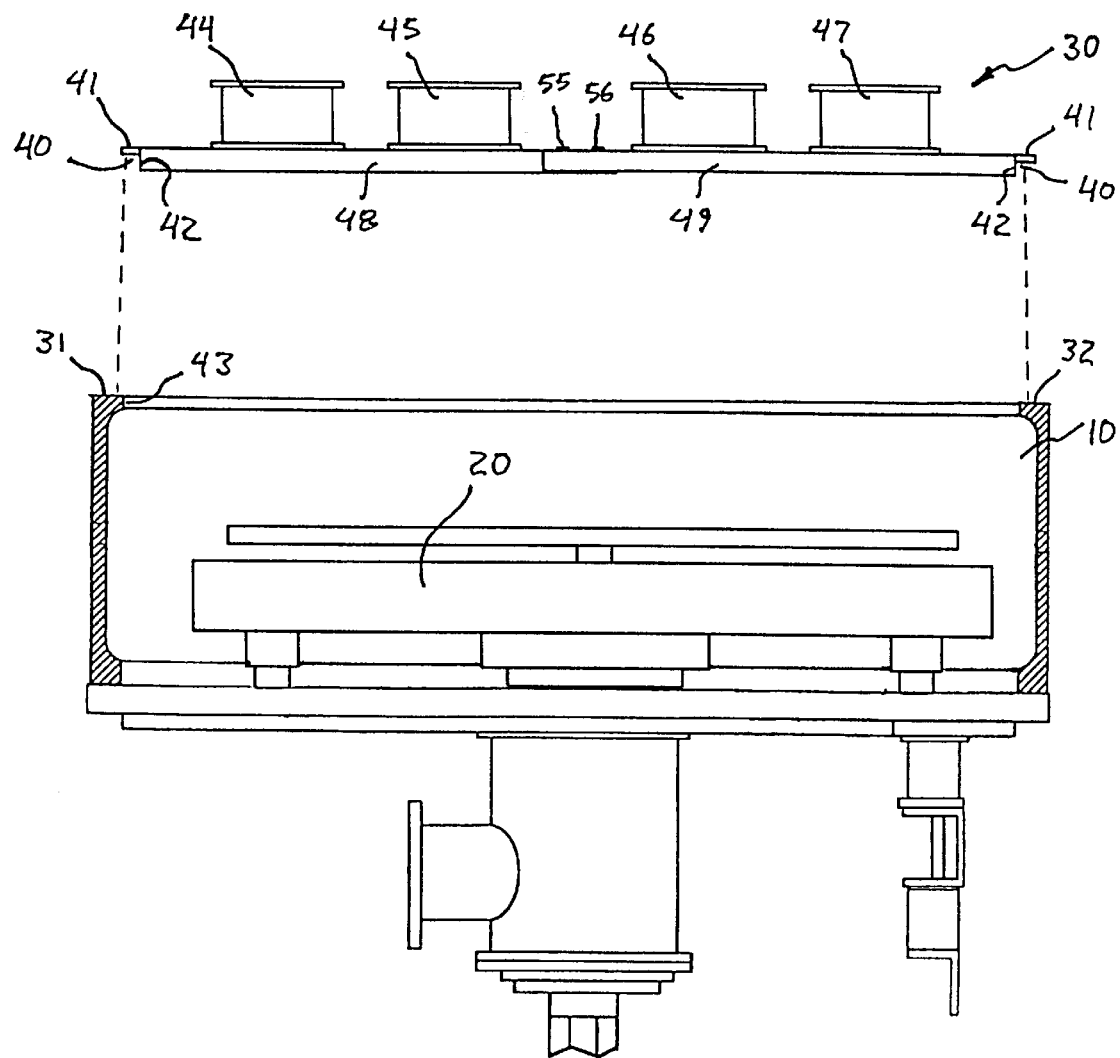
FIG. 3 is a cross-sectional view of the processing chamber having the chamber top plate and dispersion heads removed and a heater block cooling system being installed.

The cooling system 30 of the present invention is designed to fit over an open upper end 31 of a cylindrical processing chamber 10 of a conventional wafer processing apparatus. The conventional wafer processing apparatus is described above with reference to FIGS. 1 and 2 of the drawings. The cylindrical processing chamber 10 is normally closed during wafer processing by a generally circular top plate 14 that covers the upper end of the chamber 10. A plurality of dispersion heads 16 are suspended from the top plate 14 for introducing a process gas or gas mixture over the wafers being processed. The top plate 14 and the dispersion heads 16 and other components attached thereto are removed from the cylindrical processing chamber 10 to allow inspection, maintenance and repair of the various components within the processing chamber 10.

Figure 5:
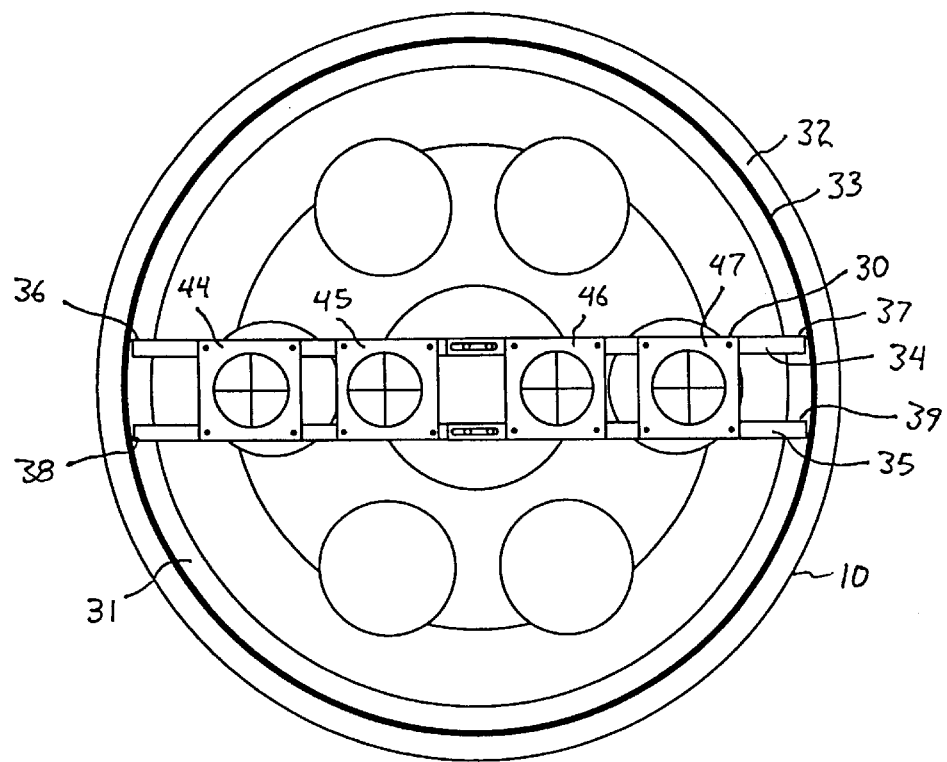
FIG. 5 is a plan view of the processing chamber having the heater block cooling system installed.
Figure 6:
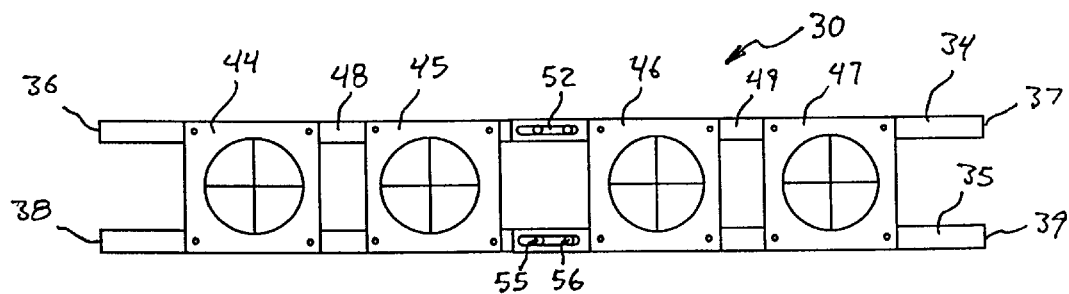
FIG. 6 is a plan view of the heater block cooling system.
Figure 7:
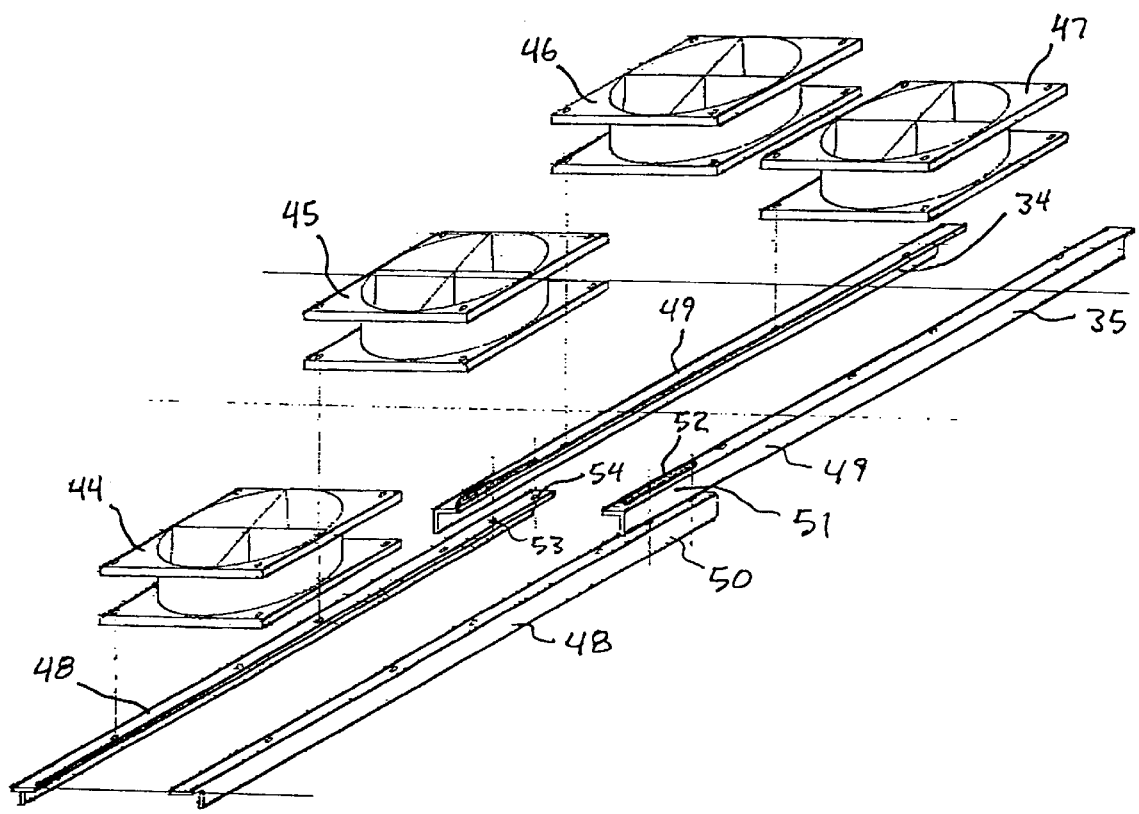
FIG. 7 is an exploded perspective view of the heater block cooling system.

With the top plate 14 removed, the open upper end 31 of the processing chamber 10 is exposed. The upper peripheral surface 32 of the processing chamber has an O-ring seal 33 extending therearound that engages and provides a seal between the top plate 14 and the processing chamber 10. The cooling system 30 of the present invention can be placed across the open upper end 31 of the processing chamber 10 and is constructed to rest on the upper peripheral surface 32 of the processing chamber 10 within the diameter of the O-ring seal 33, as shown in FIG. 5.

The cooling system 30 includes first and second frame assemblies 34, 35 having respective ends 36, 37, 38, 39 adapted to rest on the upper peripheral surface 32 of the processing chamber 10. The ends 36–39 of the frame assemblies 34, 35 each have a notched engagement structure 40 with a first portion 41 that rests on the upper peripheral surface 32 of the processing chamber 10, and a second portion 42 positioned adjacent an inner wall surface 43 of the processing chamber 10. The frame assemblies 34, 35 are preferably made of aluminum angle bar members that are lightweight and durable.

A plurality of fan assemblies 44, 45, 46, 47 are mounted to the first and second frame assemblies 34, 35 at spaced locations therealong. A first pair of fan assemblies 44, 46 are directed to push air into the processing chamber 10, and a second pair of fan assemblies 45, 47 are directed to pull air out of the processing chamber 10. The fan assemblies 44–47 are preferably arranged in a single row along the frame assemblies 34, 35 such that the fan assemblies circulate ambient air through the processing chamber 10 to provide a rapid cooling of the heater block 20 to a safe working temperature. The fan assemblies 44–47 are preferably powered by a common 120V AC electrical power source.

The frame assemblies 34, 35 each have a stationary frame member 48 and an extension frame member 49. The frame members 48, 49 have respective first ends 50, 51 secured together and second ends that correspond with the ends 36–39 adapted to rest on the upper peripheral surface 32 of the processing chamber 10. The frame assemblies 34, 35 have an adjustable length that can be adjusted to fit processing chambers 10 having different sizes and configurations. The adjustable length is provided by an elongated slot 52 formed near the first end 51 of the extension frame member 49 of each of the first and second frame assemblies 34, 35. The stationary frame member 48 of each frame assembly 34, 35 has a pair of bores 53, 54 near the first end 50 thereof that are aligned with the elongated slot 52 in the corresponding extension frame member 49. A pair of threaded fasteners 55, 56 are inserted through the bores 53, 54 and the elongated slot 52 to secure the extension frame member 49 to the stationary member 48.

In the preferred embodiment, the fan assemblies 44–47 are arranged sequentially with a first fan assembly 44 directed to push air into the processing chamber 10, a second fan assembly 45 directed to pull air out of the processing chamber 10, a third fan assembly 46 directed to push air into the processing chamber 10, and a fourth fan assembly 47 directed to pull air out of the processing chamber. The fan assemblies 44–47 are each reversible by removing threaded fasteners securing the fan assemblies 44–47 to the frame members 48, 49, and then turning the fan assemblies over to reverse the direction of air flow. Thus, various arrangements of the fan assemblies 44–47 are possible, such as having the inner two fan assemblies 45, 46 push air into the processing chamber 10 and the outer two fan assemblies 44, 47 pull air out of the processing chamber 10, and vice versa. While the preferred embodiment has four fan assemblies 44–47, a higher or lower number of fan assemblies can also be used to suit a particular application.

Figure 4:
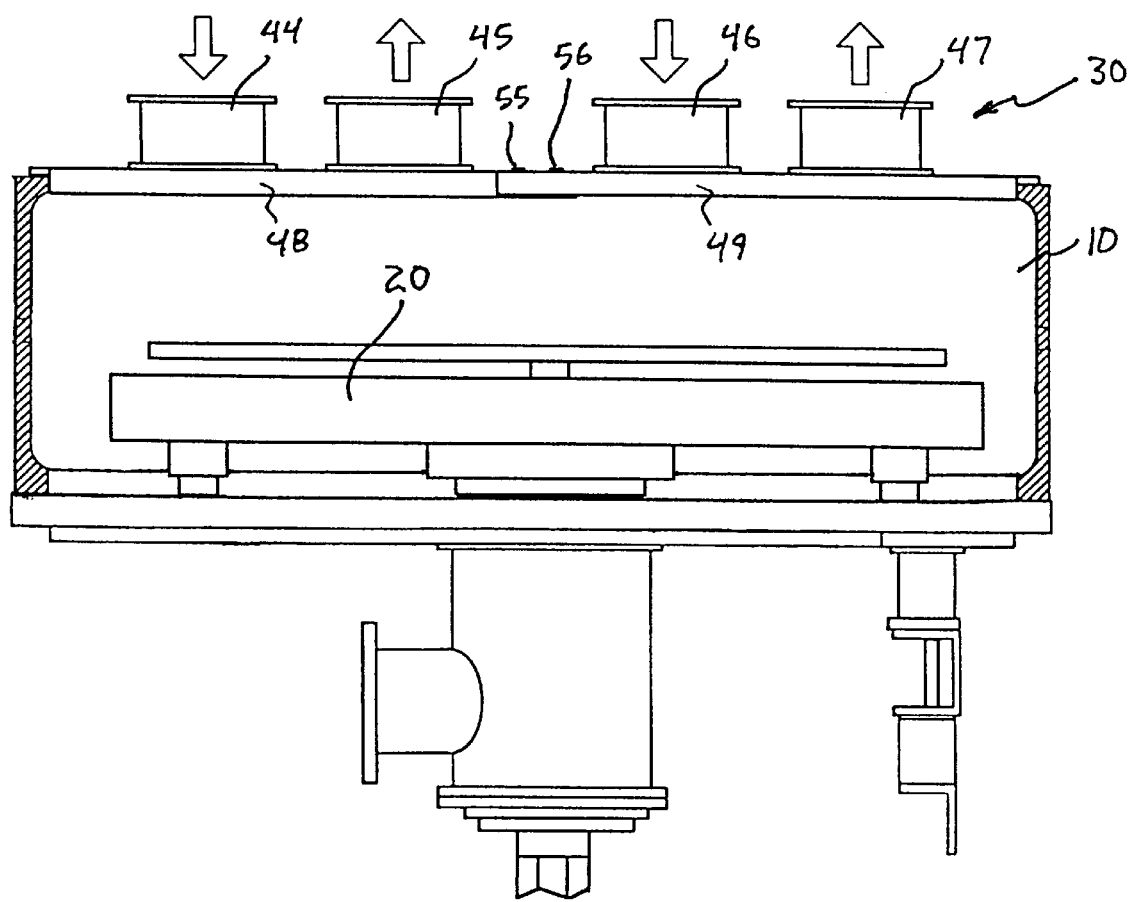
FIG. 4 is a cross-sectional view of the processing chamber having the heater block cooling system installed.

The cooling system 30 of the present invention substantially reduces the cooling time required for the heater block 20 to reach a safe working temperature, as compared to conventional cooling by free convection. For example, when four fan assemblies 44–47 each having a rated flow rate of 105 cubic feet per minute have their air flow directed as shown in FIG. 4 of the drawings, the heater block 20 within the processing chamber 10 can be cooled from its operating temperature of 400° C. to a safe working temperature of 50° C. in approximately 110 minutes. Without the cooling system, the heater block 20 will require approximately 260 minutes to be cooled from its operating temperature to a safe working temperature. The related cost savings for the increased maintenance uptime resulting from the cooling system 30 of the present invention can amount to several thousand dollars per year for a single wafer processing machine. A single cooling system 30 can be used to cool several wafer processing machines, which are subject to maintenance and repair operations at different times.

The construction of the cooling system 30 of the present invention is described above. The method for cooling a heater block 20 contained within a processing chamber 10 of a wafer processing apparatus using the cooling system 30 will now be explained.

The method comprises removing the top plate 14 of the processing chamber 10 to expose the open upper end 31 of the processing chamber 10. The cooling system 30 of the present invention is then placed across the open upper end 31 of the processing chamber 10. As explained above, the cooling system 30 has a plurality of fan assemblies 44–47 mounted to a frame 34, 35 at spaced locations along the length of the frame. After placement of the cooling system 30 over the processing chamber 10, the fan assemblies 44–47 are operated to circulate ambient air through the processing chamber 10 for a sufficient time to cool the heater block 20 within the processing chamber 10 to a safe working temperature of approximately 50 to 60° C. After the heater block 20 is cooled sufficiently, the cooling system 30 is removed and the normal maintenance and repair of the wafer processing machine can proceed. The top plate 14 is then placed back onto the upper end 31 of the processing chamber 10 to prepare the chamber 10 for further wafer processing.

It will be appreciated that the present invention is not limited to the exact constructions that have been described above and illustrated in the accompanying drawings, and that various modifications and changes can be made without departing from the scope and spirit of the invention. For example, the various shapes and dimensions and the various flow rates, pressures and temperature set forth herein are illustrative, and other shapes, dimensions, flow rates, pressures and temperatures may also be effective for the intended purpose. Moreover, the deposition process discussed herein is illustrative, and other processes may also be effective for the intended purpose. Accordingly, other embodiments and variations not described herein are to be considered within the scope of this invention as defined by the following claims.

What is claimed is:

1. A method for cooling a heater block contained within a processing chamber of a wafer processing apparatus, comprising the steps of:

providing processing chamber having a generally cylindrical shape, a top plate that covers the processing chamber during wafer processing, and a heater block positioned within the processing chamber;

removing the top plate to expose an open upper end of the processing chamber;

placing a cooling system across the open upper end of the processing chamber, said cooling system having a plurality of fan assemblies mounted to a frame at spaced locations therealong with at least a first one of said fan assemblies arranged to push air into the processing chamber and at least a second one of said fan assemblies arranged to pull air from the processing chamber; and operating said first fan assembly to push air into the processing chamber and said second fan assembly to pull air from the processing chamber to circulate ambient air through said processing chamber for a sufficient time to cool said heater block to a safe working temperature.

2. The method for cooling a heater block according to claim 1, wherein said safe working temperature is approximately 50 to 60° C.

3. The method for cooling a heater block according to claim 1, further comprising the steps of:

removing said cooling system from the open upper end of the processing chamber; and placing said top plate back onto the upper end of the processing chamber to prepare said chamber for further wafer processing.

4. A cooling system for cooling a heater block in a processing chamber of a wafer processing apparatus, comprising:

first and second frame assemblies having respective ends adapted to rest on an upper peripheral surface of a processing chamber; and a plurality of fan assemblies mounted to said frame assemblies at spaced locations therealong for circulating ambient air through said processing chamber;

wherein a length of said first and second frame assemblies is adjustable to conform to a size of the processing chamber.

5. The cooling system according to claim 4, wherein said adjustable length is provided by an elongated slot formed in an extension frame member of each of the first and second frame assemblies.

6. The cooling system according to claim 4, wherein said first frame assembly comprises a stationary frame member and an extension frame member, said frame members having respective first ends secured together and second ends adapted to rest on the upper peripheral surface of the processing chamber; and wherein said extension frame member of each frame assembly has an elongated slot formed near said first end thereof, said stationary frame member of each frame assembly has a pair of bores near said first end thereof that are aligned with said elongated slot, and each frame assembly has a pair of threaded fasteners extending through said bores and said elongated slot to secure the extension frame member to the stationary frame member.

7. The cooling system according to claim 4, wherein said first frame assembly comprises a stationary frame member and an extension frame member, said frame members having respective first ends secured together and second ends adapted to rest on the upper peripheral surface of the processing chamber.

8. The cooling system according to claim 7, wherein said second frame assembly has substantially the same construction as said first frame assembly.

9. The cooling system according to claim 4 wherein said first and second frame assemblies are made of an aluminum material.

10. The cooling system according to claim 4 wherein a notched engagement structure is formed in each of the respective ends of the first and second frame assemblies, said notched engagement structure has a first portion that rests on the upper peripheral surface of the processing chamber and a second portion positioned adjacent an inner wall surface of the processing chamber.

11. A cooling system for cooling a heater block in a processing chamber of a wafer processing apparatus, comprising:

first and second frame assemblies having respective ends adapted to rest on an upper peripheral surface of a processing chamber; and a plurality of fan assemblies mounted to said frame assemblies at spaced locations therealong for circulating ambient air through said processing chamber;

wherein said plurality of fan assemblies include a first fan assembly arranged to push air into the processing chamber and a second fan assembly arranged to pull air from the processing chamber.

12. The cooling system according to claim 11, wherein said plurality of fan assemblies comprise a third fan assembly arranged to push air into the processing chamber and a fourth fan assembly arranged to pull air from the processing chamber.

13. A cooling system for cooling a heater block in a processing chamber of a wafer processing apparatus; comprising:

first and second frame assemblies having respective ends adapted to rest on an upper peripheral surface of a processing chamber; and a plurality of fan assemblies mounted to said frame assemblies at spaced locations therealong for circulating ambient air through said processing chamber;

wherein said plurality of fan assemblies include a first fan assembly arranged to push air into the processing chamber, a second fan assembly arranged to pull air from the processing chamber, a third fan assembly arranged to push air into the processing chamber, and a fourth fan assembly arranged to pull air from the processing chamber; and wherein said fan assemblies are arranged with the second fan assembly between the first and third fan assemblies, and the third fan assembly between the second and fourth fan assemblies.

14. The cooling system according to claim 13, wherein said fan assemblies each provide an air flow of approximately 105 cubic feet per minute.

15. In combination, a wafer processing apparatus having a cylindrical processing chamber and heater block contained within the processing chamber, and a cooling system for cooling the heater block, the cooling system comprising:

first and second frame assemblies having respective ends adapted to rest on an upper peripheral surface of said cylindrical processing chamber; and first and second pairs of fan assemblies mounted to said frame assemblies at spaced locations therealong for circulating ambient air through said processing chamber;

wherein said fan assemblies are arranged in a single row along said frame assemblies and wherein said first pair of fan assemblies are arranged to push air into said processing chamber and said second pair of fan assemblies are arranged to pull air out of said processing chamber.

16. In combination, a wafer processing apparatus having a cylindrical processing chamber and a heater block contained within the processing chamber, and a cooling system for cooling the heater block, the cooling system comprising:

first and second frame assemblies having respective ends adapted to rest on an upper peripheral surface of said cylindrical processing chamber; and a plurality of fan assemblies mounted to said frame assemblies at spaced locations therealong for circulating ambient air through said processing chamber;

wherein said processing chamber has an O-ring seal extending around the upper peripheral surface thereof, and said ends of the first and second frame assemblies are constructed to rest on the upper peripheral surface of the processing chamber within the diameter of the O-ring seal.

17. The combination according to claim 16, wherein said first and second frame assemblies are adjustable in length to fit a diameter of an upper end of said processing chamber.

* * * * *